(12) United States Patent
Chiang et al.

(10) Patent No.: US 8,106,874 B2
(45) Date of Patent: Jan. 31, 2012

(54) SHIFT REGISTER AND LIQUID CRYSTAL DISPLAY USING SAME

(75) Inventors: Chien-Hsueh Chiang, Miao-Li (CN); Sz-Hsiao Chen, Miao-Li (CN)

(73) Assignee: Chimei Innolux Corporation, Miao-Li County (TW)

( * ) Notice: Subject to any disclaimer, the term of this patent is extended or adjusted under 35 U.S.C. 154(b) by 778 days.

(21) Appl. No.: 12/221,568

(22) Filed: Aug. 4, 2008

(65) Prior Publication Data

US 2009/0033642 A1      Feb. 5, 2009

(30) Foreign Application Priority Data

Aug. 3, 2007   (CN) .......................... 2007 1 0075530

(51) Int. Cl.
*G09G 3/36* (2006.01)

(52) U.S. Cl. ...................................... 345/100

(58) Field of Classification Search .................... 345/84, 345/89–100, 204; 377/64, 67, 79, 81
See application file for complete search history.

(56) References Cited

U.S. PATENT DOCUMENTS

| | | | |
|---|---|---|---|
| 5,990,857 A * | 11/1999 | Kubota et al. | 345/98 |
| 7,027,550 B2 | 4/2006 | Lin | |
| 7,286,627 B2 * | 10/2007 | Tsai et al. | 377/64 |
| 7,825,888 B2 * | 11/2010 | Tobita et al. | 345/100 |
| 2003/0020520 A1 * | 1/2003 | Miyake et al. | 327/112 |
| 2004/0217935 A1 * | 11/2004 | Jeon et al. | 345/100 |
| 2005/0036581 A1 * | 2/2005 | Lin | 377/54 |
| 2006/0125518 A1 | 6/2006 | Morosawa et al. | |

* cited by examiner

*Primary Examiner* — Chanh Nguyen
*Assistant Examiner* — Pegeman Karimi
(74) *Attorney, Agent, or Firm* — Altis Law Group, Inc.

(57) ABSTRACT

A shift register of the present disclosure comprises a plurality of shift register units using alternating clock signals to shift signals. The shift register outputs signals having substantially no overlap with adjacent signals. The shift register may be employed in a liquid crystal display.

12 Claims, 5 Drawing Sheets

SHIFT REGISTER AND LIQUID CRYSTAL DISPLAY USING SAME

FIELD OF THE INVENTION

Embodiments of the present disclosure relate to a shift register, and more particularly to a shift register in a liquid crystal display (LCD).

GENERAL BACKGROUND

Shift registers are core circuit units of integrated circuits that are used in products such as thin film transistor liquid crystal displays (TFT-LCDs). A shift register provides sequential pulse signals to scanning lines of a TFT-LCD, so as to control on and off states of TFTs connected to the scanning lines.

Figure 6:
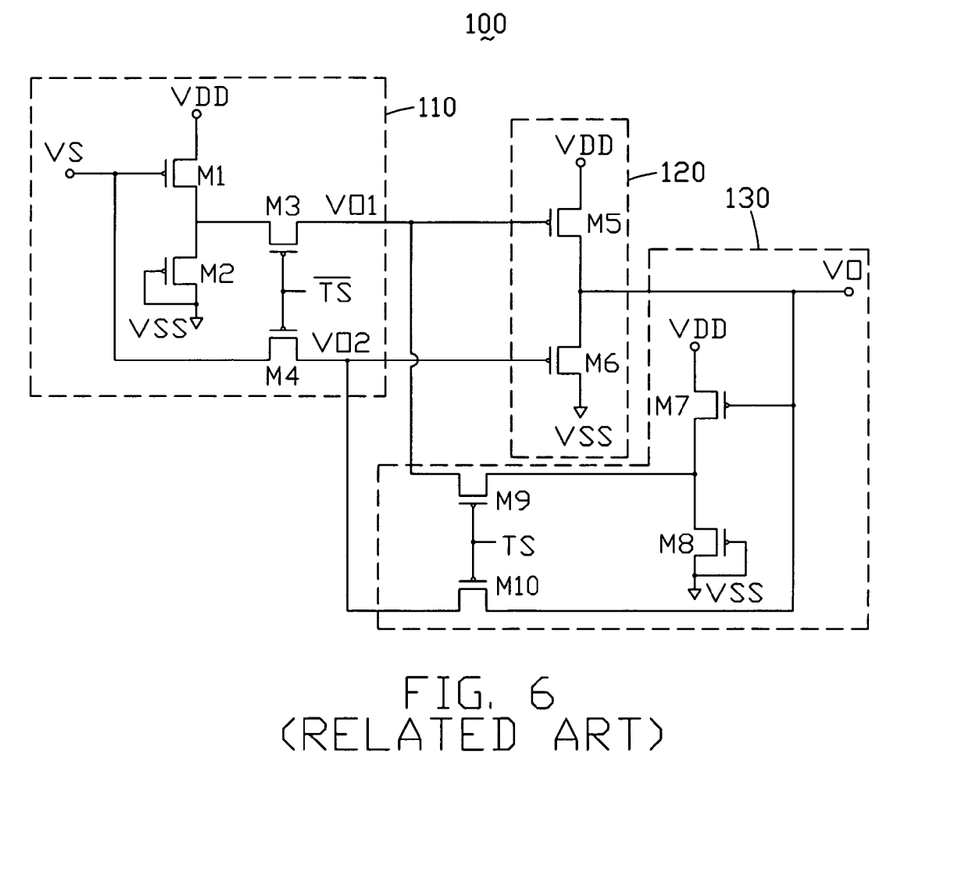
FIG. 6 is a circuit diagram of a shift register unit of a conventional shift register.

Referring to FIG. 6, one such shift register unit 100 includes a first clock inversion circuit 110, an inverter 120, and a second clock inversion circuit 130. All transistors in the first clock inversion circuit 110, the inverter 120, and the second clock inversion circuit 130 are PMOS (P-channel metal oxide semiconductor) transistors. The first clock inversion circuit 110 receives an output signal VS from a pre-stage shift register unit (not shown). The output signal VS functions as a start signal.

The first clock inversion circuit 110 includes a first transistor M1, a second transistor M2, a third transistor M3, a fourth transistor M4, a first output VO1, and a second output VO2. The inverter 120 includes a fifth transistor M5 and a sixth transistor M6. The inverter 120 outputs an output signal that serves as a shift register signal VO. The second clock inversion circuit 130 and the first clock inversion circuit 120 have similar structures. The second clock inversion circuit 130 includes a seventh transistor M7, an eighth transistor M8, a ninth transistor M9, and a tenth transistor M10.

Figure 7:
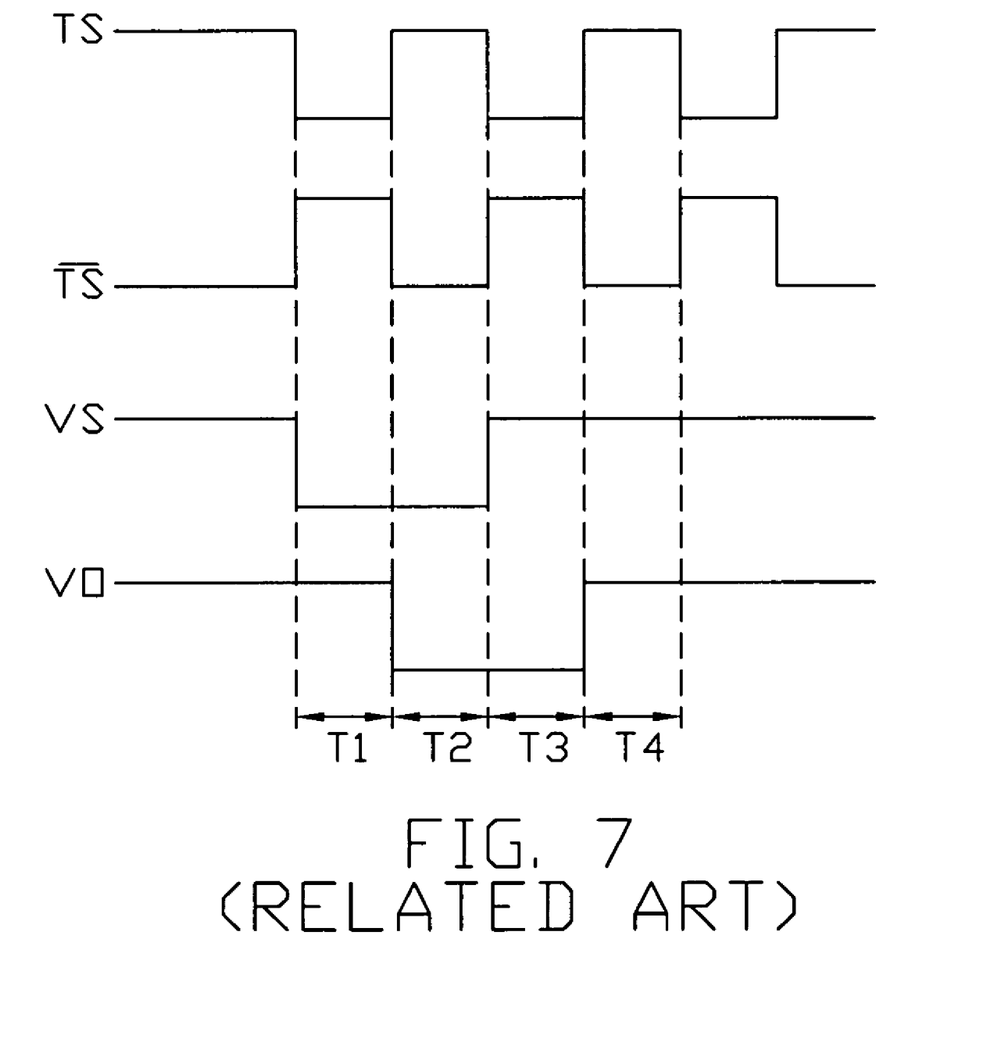
FIG. 7 is a sequence waveform diagram of pulse signals of the shift register of FIG. 6.

Referring to FIG. 7, a sequence waveform diagram of pulse signals of the shift register unit 100 is shown. During a period t1, the inverter 120 and the second clock inversion circuit 130 perform a latch operation. During the latch operation, the sixth transistor M6 is switched off such that the shift register signal VO of the inverter 120 keeps an original state of the previous stage. During a period t2, no latch operation is performed. The start signal VS is applied to the inverter 120, and the second clock inversion circuit 130 keeps the same state as the start signal VS. Furthermore, the first transistor M1 is switched on because the start signal VS jumps to a low voltage, such that the fifth transistor M5 is switched off and the sixth transistor M6 is switched on. Thus, the inverter 120 outputs the shift register signal VO having a low level through the activated sixth transistor M6. During a period t3, the inverter 120 and the second clock inversion circuit 130 perform latch operation. The inverter 120 maintains output of a low level shift register signal VO through the activated sixth transistor M6. During a period t4, no latch operation is performed. The inverter 120 stops output of the low-level shift register signal VO.

The shift register unit 100 outputs a low level shift register signal during period t2, and at the same time, the next-stage shift register unit (not shown) also outputs a low level shift register signal. Thus, adjacent shift register units (e.g., the shift register unit 100 and the next-stage shift register unit) may cause signal distortions between adjacent shift register units due to overlapping adjacent shift register signals. As a result, the shift register unit 100 is liable to be unstable. Accordingly, an LCD device employing the shift register unit 100 may have a distorted display quality because adjacent scanning lines corresponding to adjacent columns or rows of TFTs may be scanned simultaneously by the shift register pulse signals instead of being scanned sequentially.

What is needed, therefore, is a shift register which can overcome the above-described deficiencies. What is also needed is an LCD device including the shift register.

SUMMARY

In an exemplary embodiment, a shift register includes at least two clock transmission lines configured for transmitting a first clock pulse and a second clock pulse, and a plurality of stages. The first clock pulse and the second clock pulse have an amplitude, a duty ratio, and a frequency, and the first clock pulse has an inverse phase relative to a phase of the second clock pulse. The plurality of stages receive the clock pulses from the at least two clock transmission lines, and output a plurality of output-signals in sequence. A first alternating stage of the plurality of stages receives the first clock pulse, and a second alternating stage of the plurality of stages receives the second clock pulse. Each of the stages includes an input circuit, an output circuit, a voltage high input, a voltage low input, a first output, a second input, a first output, and a second output. The voltage high input receives a high-level voltage signal, and the voltage low input receives a low-level voltage signal. The input circuit receives a pulse signal from a previous stage and generates a reference signal. The first stage receives the start signal applied by an external circuit. The output circuit is configured for generating a shift register signal to the first input of a next stage from the first output, and the pulse signal to the second input of the previous stage from the second output according to the reference signal and one of the first clock pulse and the second clock pulse, wherein the shift register signal is outputted to an external circuit.

Other novel features and advantages will become more apparent from the following detailed description when taken in conjunction with the accompanying drawings.

DETAILED DESCRIPTION OF CERTAIN INVENTIVE EMBODIMENTS

Figure 1:
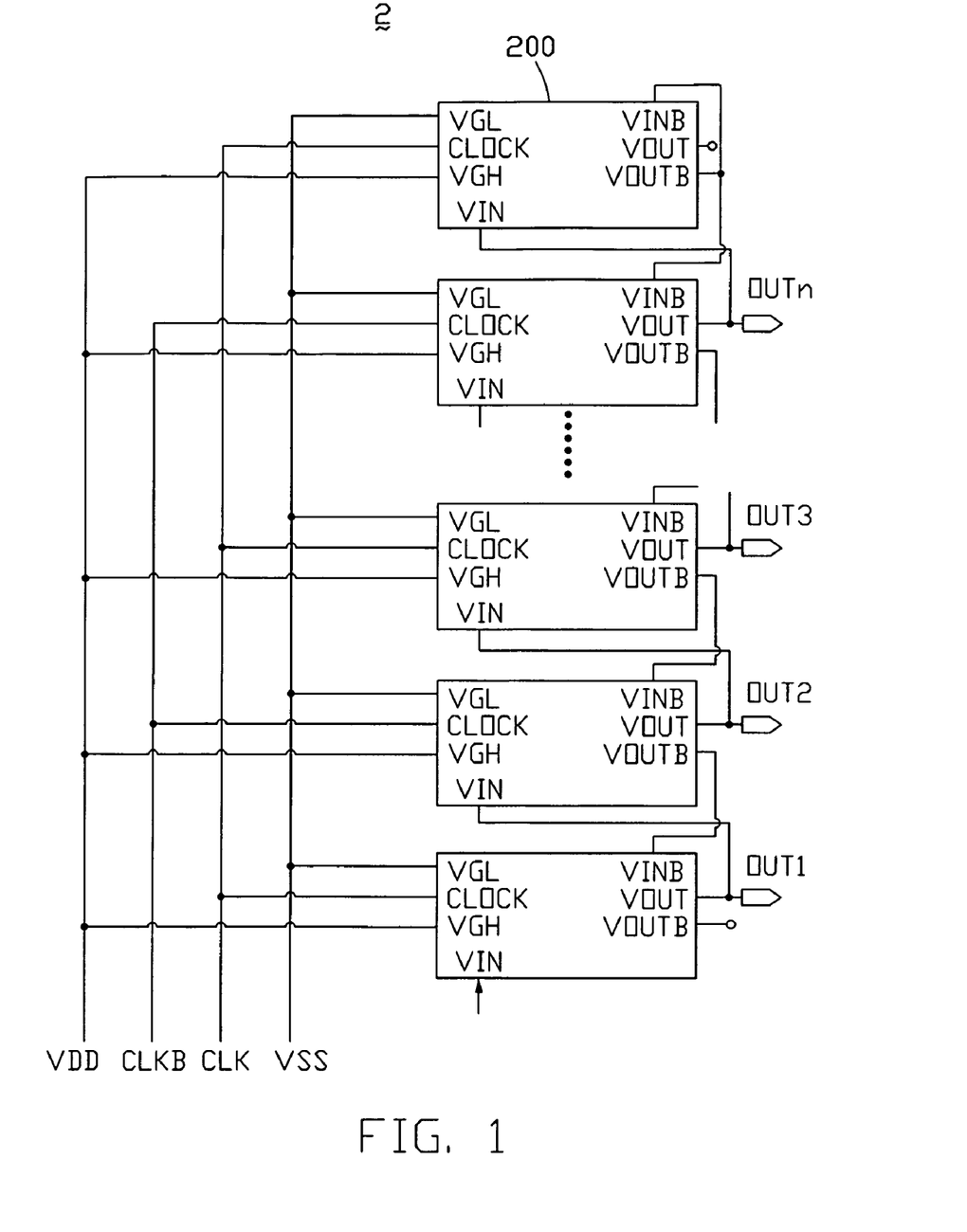
FIG. 1 illustrates a circuit diagram of one embodiment of a shift register of the present disclosure including a plurality of shift register units.

FIG. 1 illustrates a circuit diagram of one embodiment of a shift register 2 of the present disclosure including a plurality of shift register units 200. Each of the shift register units 200 includes a clock input CLOCK, a first input VIN, a second input VINB, a first output VOUT, a second output VOUTB, a high level input VGH, and a low level input VGL.

The first output VOUT of the last shift register unit 200 may be left floating to form a floating output. The second input VINB of each shift register unit 200 is connected to a next stage of the shift register units 200.

The second input VINB of the last shift register unit 200 is connected to the second output VOUTB thereof. The first input VIN of each one of shift register units 200 is connected to the first output VOUT of previous one of the shift register units 200 except the first one of the shift register units 200 that is connected to an external circuit (not shown). The first outputs VOUT serve to output a plurality of shift register signals sequentially and respectively.

The clock input CLOCK of each shift register unit 200 receives either a first clock signal CLK or a second clock signal CLKB provided by an external circuit (not shown). It should be noted that the clock inputs CLK of two adjacent shift register units 200 alternately receives the first CLK and second clock signal CKLB from the external circuit.

In one embodiment, the first clock signal CLK and the second clock signal CLKB may be substantially identical in amplitude, duty ratio, and frequency, but are inverse in phase relative to each other. In one embodiment, a duty ratio of the first clock signal CLK and second clock signal CLKB may be 50%.

A high level signal, such as a high level voltage VDD, may be inputted to the high level input VGH of the shift register unit 200. A low level signal, such as a ground voltage VSS, may be inputted to the low level input VGL of the shift register unit 200.

Figure 2:
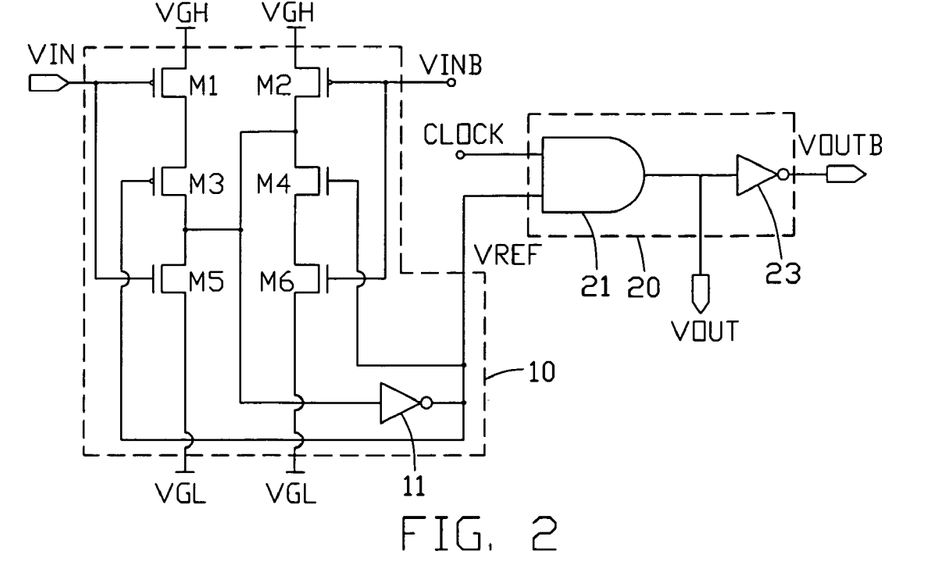
FIG. 2 illustrates a low-level schematic diagram of one embodiment of the shift register unit of FIG. 1.

FIG. 2 illustrates a low-level schematic diagram of one embodiment of the shift register unit 200. In one embodiment, the shift register unit 200 includes an input circuit 10 and an output circuit 20.

The input circuit 10 is connected between the high level input VGH and the low level input VGL, and is configured for generating a reference level signal VREF using inputs from a previous stage and a next stage of the shift register unit 200. The output circuit 20 is configured for providing a shift register signal to the external circuit, a start signal to the next stage shift register unit 200, and a stop signal to the previous stage shift register unit 200, using inputs from one of the first and second clock signals CLK, CLKB and the reference level signal VREF.

The input circuit 10 includes a first transistor M1, a second transistor M2, a third transistor M3, a fourth transistor M4, a fifth transistor M5, a sixth transistor M6, and a first inverter 11. The high level input VGH is connected to the low level input VGL via a source and a drain of the first transistor M1, a source and a drain of the third transistor M3, and a source and a drain of the fifth transistor M5 in series. The high level input VGH is further connected to the low level input VGL via a source and a drain of the second transistor M2, a source and a drain of the fourth transistor M4, and a source and a drain of the sixth transistor M6 in series.

Gates of the first and fifth transistors M1, M5 are connected to the first input VIN, and gates of the second and sixth transistors M2, M6 are connected to the second input VINB. The drain of the third transistor M3 is connected to the drain of the second transistor M2, and connected to an input terminal of the first inverter 11. An output terminal of the first inverter 11 is connected to gates of the third transistor M3 and the fourth transistor M4. The first, second, and third transistors M1, M2, M3 are P-channel metal oxide semiconductor transistors, and the fourth, fifth, and sixth transistors M4, M5, M6 are N-channel metal oxide semiconductor transistors. A voltage level of the output terminal of the first inverter 11 is defined as the reference level signal VREF.

The output circuit 20 includes an AND gate 21 and a second inverter 23. The AND gate 21 includes an output terminal connected to the first output VOUT and also to the input terminal of the second inverter 23. The AND gate further includes an input terminal connected to the output terminal of the first inverter 11, and an input terminal connected to the clock input CLOCK. The output terminal of the second inverter 23 is connected to the second output VOUTB.

Figure 3:
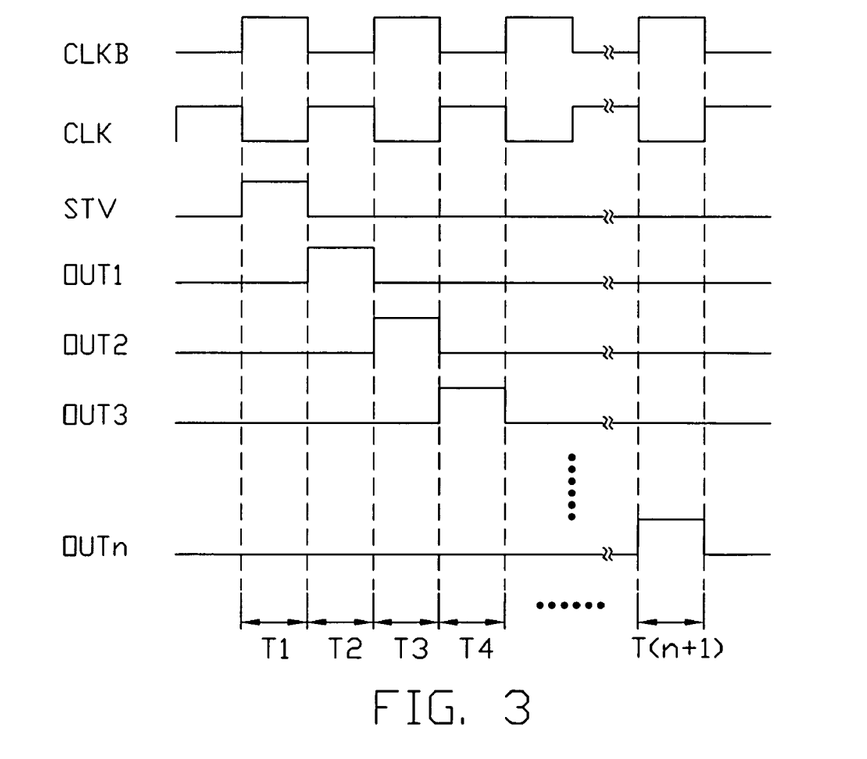
FIG. 3 illustrates a sequence waveform diagram of exemplary pulse signals of the shift register unit of FIG. 1.

FIG. 3 illustrates a sequence waveform diagram of exemplary pulse signals of the shift register unit of FIG. 1 A start signal STV is applied to the first register unit 200 from an external circuit. Shift register signals OUT1-OUTn are outputted by each respective shift register unit (assuming a number of the shift register units 200 is n, where n is a natural number). The shift register 2 is initialized during a clock first cycle period, and the second input VINB receives a stop signal from a next stage register unit 200 and the reference level signal VREF is reset to low level signal. Detailed working procedure from the second cycle of the shift register 2 is described as following.

During a period T1, the start signal STV is at a high level, the first clock signal CLK is at a low level, and the second clock signal CLKB is at a high level. In the first shift register unit 200, the first transistor M1 is switched off while the fifth transistor M5 is switched on. The low level voltage VSS is applied to the input terminal of the first inverter 11 via the low level input VGL and the on-state fifth transistor M5. The first inverter 11 outputs a high level signal such that the reference level signal is at the high level signal. The first output VOUT outputs a low level signal and the second output VOUTB outputs a high level signal. The reference level signal VREF of each one of the $2^{nd}$-$n^{th}$ shift register units 200 remains at the low-level signal. The first output VOUT of each one of the $2^{nd}$-$n^{th}$ shift register units 200 remains at the low-level.

During a period T2, the start signal STV is a low level signal. The first clock signal CLK is at a high level signal and the second clock signal CLKB is at a low level signal. Because the reference level signal of the first shift register unit 200 is at a high level and the receiving first clock signal CLK jumps to the high level, the first output VOUT of the first shift register unit 200 outputs a high-level shift register signal OUT1.

In the second shift register unit 200, the first output VOUT receives the high level signal OUT1 and turns the reference level signal VREF high-level. The first output VOUT is at a low level. The reference level signal of each one of the $3^{rd}$-$n^{th}$ shift register units 200 remains at the low-level as the previous working cycle.

During a period T3, the first clock signal CLK jumps to a low level, and the second clock signal CLKB jumps to a high level. The first output VOUT of the second shift register unit 200 outputs a high level shift register signal OUT2. The second output VOUTB is at a low-level. The second input VINB of the first shift register unit 200 receives the low level from the second output VOUTB of the second shift register unit 200, so that the second transistor M2 of the first shift register unit 200 is switched on and the sixth transistor M6 of the first shift register unit 200 is switched off. The high level voltage VDD is applied to first inverter 11 of the first shift register unit 200 via the high level input VGH of the first shift register unit 200, the on-state second transistor M2 of the first shift register unit 200. Thus, the first inverter 11 of the first shift register unit 200 outputs a low-level signal, and the reference level signal VREF of the first shift register unit 200 is pulled down to the low level. The first output VOUT of the first shift register unit 200 is at the low level.

The first input VIN of the third shift register unit 200 receives the high level signal OUT2 and the reference level signal VREF of the third shift register unit 200 is pulled up to the high level. Because the first clock signal is low-level, the first output VOUT of the third shift register unit 200 is at the low level.

The reference level signal of each one of the $4^{th}$-$n^{th}$ shift register units 200 remains at the low-level as in the previous working cycle.

Accordingly, during the period T2 to the period T(n+1), the plural shift register units 200 output the shift register signals sequentially.

Because the first output VOUT of the shift register unit 200 is connected to an input VIN of a successive shift register unit of the shift register unit 200, the output signal OUT1 of the first output VOUT is an input signal of the input VIN of successive shift register unit. The successive shift register unit receives an inverse clock signal CLKB, and has a similar working procedure as the above-described working procedure of the shift register unit 200 during the period T1-T4. A second output VOUT2 of the successive shift register unit outputs a high-level shift register signal during the period T3 following the shift register signal output by the shift register unit 200.

In summary, each of the shift register units 200 of the shift register 2 has only one high level shift register signal output during each moment, therefore there is no overlapping signals for the plural shift register signals OUT1 through OUTn.

Figure 4:
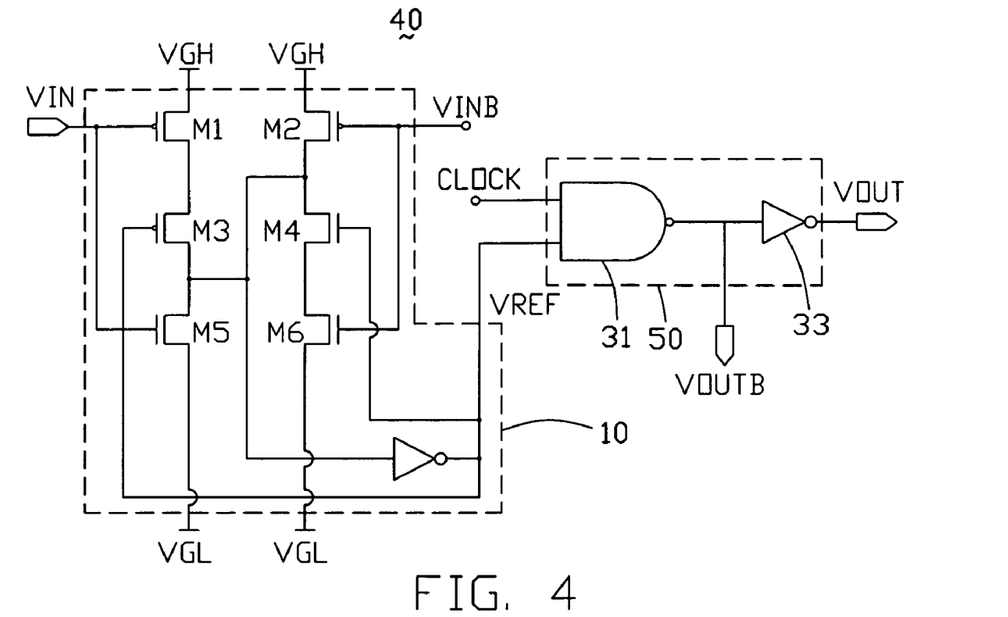
FIG. 4 illustrates a circuit diagram of another embodiment of a shift register unit of the present disclosure.

FIG. 4 is a circuit diagram of a shift register unit 40 according to another embodiment of the present disclosure. In one embodiment, the shift register unit 40 has a substantially similar structure to that as the shift register unit 200. However, the shift register unit 40 includes an output circuit 50 including an NAND gate 31 and an inverter 33. The NAND gate 31 includes an input terminal configured to receive a clock signal from an external circuit (not shown), an another input terminal connected to the input circuit 10, and an output terminal connected to an input terminal of the inverter 33 and a second output VOUTB. An output terminal of the inverter 33 serves as a first output VOUT. The first output VOUT is connected to a first input of a next stage shift register unit and the second output VOUTB is connected to a second input of a previous shift register unit.

Figure 5:
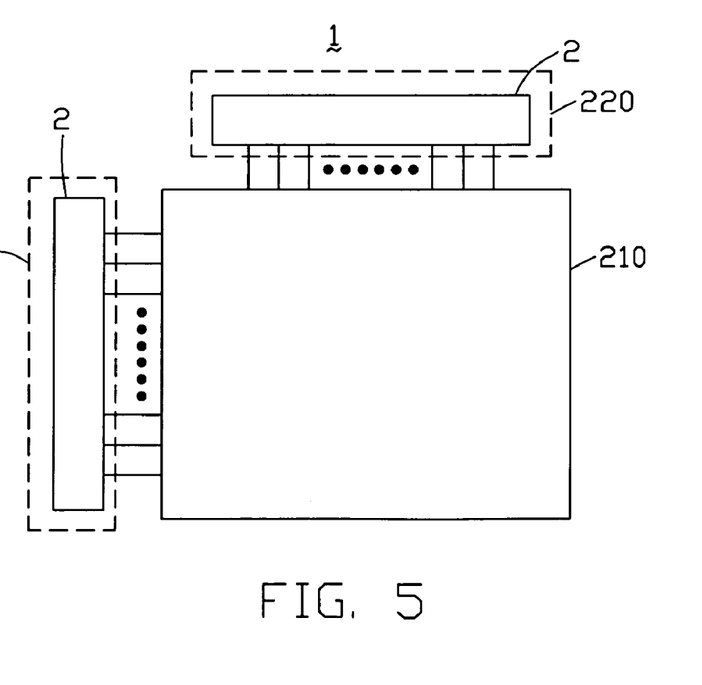
FIG. 5 illustrates one embodiment of a liquid crystal display employing at least one of the shift registers of FIG. 1.

FIG. 5 illustrates one embodiment of a liquid crystal display 1 employing at least one of the shift registers 2. The liquid crystal display 1 may employ the shift register 2 in order to improve display quality. In one embodiment, the liquid crystal display 1 includes a liquid crystal panel 210, a gate driving circuit 230, and a data driving circuit 220. The data driving circuit 220 and the gate driving circuit 230 each include at least one shift register 2. Each of the shift register 2 provides a plurality of shift register signals sequentially to the liquid crystal panel 210.

It is to be further understood that even though numerous characteristics and advantages of the present inventive embodiments have been set out in the foregoing description, together with details of the structures and functions of the embodiments, the disclosure is illustrative only, and that changes may be made in detail, especially in matters of shape, size, and arrangement of parts within the principles of the present disclosure to the full extent indicated by the broad general meaning of the terms in which the appended claims are expressed.

What is claimed is:

1. A shift register comprising:
at least two clock transmission lines configured for transmitting a first clock pulse and a second clock pulse, wherein the first clock pulse and the second clock pulse have an amplitude, a duty ratio, and a frequency, and wherein the first clock pulse has an inverse phase relative to a phase of the second clock pulse;
a plurality of stages receiving the clock pulses from the at least two clock transmission lines, and outputting a plurality of output-signals in sequence, wherein a first alternating stage of the plurality of stages receives the first clock pulse, and wherein a second alternating stage of the plurality of stages receives the second clock pulse;
wherein each of the plurality of stages comprises:
a voltage high input, a voltage low input, a first input, a second input, a first output, and a second output, wherein the voltage high input receives a high-level voltage signal, wherein the voltage low input receives a low-level voltage signal;
an input circuit configured for receiving a first pulse signal from a previous stage for generating a reference signal, wherein a first stage of the plurality of stages receives a start signal applied by an external circuit;
an output circuit configured for generating the first pulse signal to the first input of a next stage from the first output of the previous stage, and a second pulse signal to the second input of the previous stage from the second output of the next stage according to the reference signal, and one of the first clock pulse and the second clock pulse;
wherein the input circuit comprises a first transistor, a second transistor, a third transistor, a fourth transistor, a fifth transistor, a sixth transistor, and a first inverter, wherein the voltage high input is first connected to the voltage low input via a source and a drain of the first transistor, a source and a drain of the third transistor, and a source and a drain of the fifth transistor connected sequentially and in series, and further first connected to the voltage low input via a source and a drain of the second transistor, a source and a drain of the fourth transistor, and a source and a drain of the sixth transistor connected sequentially and in series, gates of the first and fifth transistors are connected to the first input, gates of the second and sixth transistors are connected to the second input directly, gates of the third and fourth transistors are connected to an output terminal of the first inverter, the drains of the second and third transistors are connected together directly.

2. The shift register of claim 1, wherein the output circuit comprises an AND gate and a second inverter, wherein a first input terminal of the AND gate is connected to the output terminal of the first inverter, a second input terminal of the AND gate receiving one of the first and second clock signals, the output terminal of the AND gate connecting to the first output of a stage and connecting to an input terminal of the second inverter, the first output of the first alternating stage connecting to the first input of the second alternating stage, and the second output of the first alternating stage connecting to the second input of the second alternating stage.

3. The shift register of claim 2, wherein the first, second and third transistors are P-channel metal oxide semiconductor transistors, and the fourth, fifth, and sixth transistors are N-channel metal oxide semiconductor transistors.

4. The shift register of claim 1, wherein the output circuit comprises an NAND gate and a second inverter, wherein a first input terminal of the NAND gate is connected to the output terminal of the first inverter, a second input terminal of the NAND gate connecting to the clock signal input for receiving one of the first and second clock signals, the output terminal of the NAND gate connecting to the second output and connecting to the an input terminal of the second inverter, an output of the second inverter connecting to the first output, the first output connecting to the first input of a next adjacent stage of the shift register units, the second output connecting to the second input of a previous adjacent stage of the shift register units.

5. A shift register comprising:
a plurality of shift register units connected in stages, each shift register unit comprising:
a first output;
a second output;
an input circuit; and
an output circuit comprising an inverter, the first output connected to the second output via the inverter;
wherein the shift register unit further comprises a voltage high input for receiving a high-level voltage and a voltage low input for receiving a low-level voltage, the input circuit connecting between the voltage high input and the voltage low input;
wherein the shift register unit further comprises a first input and a second input, wherein the input circuit comprises a first transistor, a second transistor, a third transistor, a fourth transistor, a fifth transistor, a sixth transistor, and a first inverter, wherein the voltage high input is first connected to the voltage low input via a source and a drain of the first transistor, a source and a drain of the third transistor, and a source and a drain of the fifth transistor connected sequentially and in series, and further first connected to the voltage low input via a source and a drain of the second transistor, a source and a drain of the fourth transistor, and a source and a drain of the sixth transistor connected sequentially and in series, gates of the first and fifth transistors connecting to the first input, gates of the second and sixth transistors directly connecting to second input, gates of the third and fourth transistors connecting to an output terminal of the first inverter, the drains of the second and third transistors directly connecting together;
wherein the input circuit is configured for providing a reference signal, wherein the reference signal of the input circuit is based on a signal from a previous adjacent stage of the shift register units and a clock signal;
wherein the output circuit is configured for providing a stop pulse to the previous adjacent stage of the shift register units via one of the first and second outputs, and a shift pulse to an external circuit via the other one of the first and second outputs.

6. The shift register of claim 5, wherein the shift register unit further comprises a clock signal input, wherein the output circuit further comprises an AND gate, wherein a first input terminal of the AND gate is connected to the output terminal of the first inverter, a second input terminal of the AND gate connecting to the clock signal input for receiving one of the first and second clock signals, the output terminal of the AND gate connecting to the first output and connecting to the an input terminal of the inverter of the output circuit, an output of the inverter of the output circuit connecting to the second output, the first output connecting to the first input of adjacent next one of the shift register units, the second output connecting to the second input of adjacent previous one of the shift register units.

7. The shift register of claim 6, wherein the first, second, and third transistors are P-channel metal oxide semiconductor transistors, and the fourth, fifth, and sixth transistors are N-channel metal oxide semiconductor transistors.

8. The shift register of claim 5, wherein the shift unit further comprises a clock signal input, wherein the output circuit further comprises an NAND gate, wherein a first input terminal of the NAND gate is connected to the output terminal of the first inverter, a second input terminal of the NAND gate connecting to the clock signal input for receiving one of the first and second clock signals, the output terminal of the NAND gate connecting to the second output and connecting to the an input terminal of the inverter of the output circuit, an output of the inverter of the output circuit connecting to the first output, the first output connecting to the first input of a next adjacent stage of the shift register units, the second output connecting to the second input of a previous adjacent stage of the shift register units.

9. The shift register of claim 5, wherein the output circuit is further configured for providing a start pulse to the next adjacent stage of the shift register units via one of the first and second outputs.

10. The shift register of claim 5, wherein the shift register unit further comprises a first input and a second input, wherein the input circuit comprises a first transistor, a second transistor, a third transistor, a fourth transistor, a fifth transistor, a sixth transistor, and a first inverter, wherein the voltage high input is first connected to the voltage low input via a source and a drain of the first transistor, a source and a drain of the third transistor, and a source and a drain of the fifth transistor sequentially, and further first connected to the voltage low input via a source and a drain of the second transistor, a source and a drain of the fourth transistor, and a source and a drain of the sixth transistor sequentially, gates of the first and fifth transistors connecting to the first input, gates of the second and sixth transistors connecting to the second input, gates of the third and fourth transistors connecting to an output terminal of the first inverter, the drains of the second and third transistors connecting together.

11. A liquid crystal display comprising:
a liquid crystal panel;
a gate driving circuit; and
a data driving circuit;
wherein each of the gate driving circuit and the data driving circuit comprises at least one shift register, wherein each of the shift registers comprises a plurality of shift register units connected in stages, each shift register unit comprising:
an input circuit; and
an output circuit;
wherein the input circuit is configured for providing a reference signal under control of an adjacent previous stage of the shift register units and an adjacent next stage of the shift register units;
wherein the output circuit is configured for providing a start pulse to a next adjacent stage of the shift register units, a stop pulse to the previous stage of the shift register units, and a pulse to an external circuit of the liquid crystal panel;
wherein the shift register unit further comprises a voltage high input for receiving a high-level voltage and a voltage low input for receiving a low-level voltage, the input circuit connecting between the voltage high input and the voltage low input;
wherein the shift register unit further comprises a first input and a second input, wherein the input circuit comprises a first transistor, a second transistor, a third transistor, a fourth transistor, a fifth transistor, a sixth transistor, and a first inverter, wherein the voltage high input is connected to the voltage low input via a source and a drain of the first transistor, a source and a drain of the third transistor, and a source and a drain of the fifth transistor in series, and further connected to the voltage low input via a source and a drain of the second transistor, a source and a drain of the fourth transistor, and a source and a drain of the sixth transistor in series, gates of the first and fifth transistors connecting to the first input, gates of the second and sixth transistors connecting to second input, gates of the third and fourth transistors connecting to an output terminal of the first inverter, the drains of the second and third transistors connecting together;

wherein the shift register unit further comprises a first output, a second output and a clock signal input, wherein the output circuit comprises an AND gate and a second inverter, wherein a first input terminal of the AND gate is connected to the output terminal of the first inverter, a second input terminal of the AND gate connecting to the clock signal input for receiving one of the first and second clock signals, the output terminal of the AND gate connecting to the first output and connecting to the an input terminal of the second inverter, an output of the second inverter connecting to the second output, the first output connecting to the first input of adjacent next one of the shift register units, the second output connecting to the second input of adjacent previous one of the shift register units.

12. The liquid crystal display of claim 11, wherein the first, second, and third transistors are P-channel metal oxide semiconductor transistors, and the fourth, fifth, and sixth transistors are N-channel metal oxide semiconductor transistors.

* * * * *